United States Patent [19]
Abe et al.

[11] Patent Number: 5,521,522
[45] Date of Patent: May 28, 1996

[54] PROBE APPARATUS FOR TESTING MULTIPLE INTEGRATED CIRCUIT DIES

[75] Inventors: Yuichi Abe; Masao Yamaguchi, both of Tokyo; Munetosi Nagasaka, Yamanashi-ken, all of Japan

[73] Assignees: Tokyo Electron Limited, Tokyo; Tokyo Electron Yamanashi Limited, Nirasaki, both of Japan

[21] Appl. No.: 151,367

[22] Filed: Nov. 12, 1993

[30]    Foreign Application Priority Data

Nov. 13, 1992  [JP]  Japan ................................. 4-328920

[51] Int. Cl.⁶ ....................................................... G01R 1/06
[52] U.S. Cl. ............................................ 324/758; 324/754
[58] Field of Search ................................ 324/73.1, 158.1, 324/758, 750, 765; 473/8; 356/400, 401, 399; 257/40, 48; 348/126, 130

[56]             References Cited

U.S. PATENT DOCUMENTS

| | | |
|---|---|---|
| 4,063,172 | 12/1977 | Reid . |
| 4,535,424 | 8/1985 | Reid . |
| 4,585,991 | 4/1986 | Reid . |
| 4,677,474 | 6/1987 | Sato et al. ................................ 324/758 |
| 4,754,316 | 6/1988 | Reid . |
| 4,954,458 | 9/1990 | Reid . |
| 4,985,673 | 1/1991 | Horie ........................................ 324/765 |
| 4,985,676 | 1/1991 | Karasawa ................................ 324/758 |
| 5,012,187 | 4/1991 | Littlebury ................................ 324/765 |
| 5,091,692 | 2/1992 | Ohno et al. ............................. 324/758 |
| 5,412,329 | 5/1995 | Iino et al. ................................ 324/754 |
| 5,416,592 | 5/1995 | Mori et al. .............................. 356/400 |

*Primary Examiner*—Vinh P. Nguyen
*Attorney, Agent, or Firm*—Oblon, Spivak, McClelland, Maier & Neustadt

[57]             ABSTRACT

There is provided a probe apparatus with a stage for holding a wafer on which a plurality of chips are regularly arranged such that the chips are arranged substantially in an XY plane, a large number of contactors facing the wafer held on the stage, provided to corresponding to respective pads of the chips such as to be brought into contact collectively with the pads of all the device circuits on the wafer, tester for transmitting/receiving a test signal to/from the device via the contactors, elevator device for elevating the stage in a Z-axis direction, alignment device for moving the stage in an X-axis and/or Y-axis direction, and controller for controlling the alignment device and the elevator device.

14 Claims, 6 Drawing Sheets

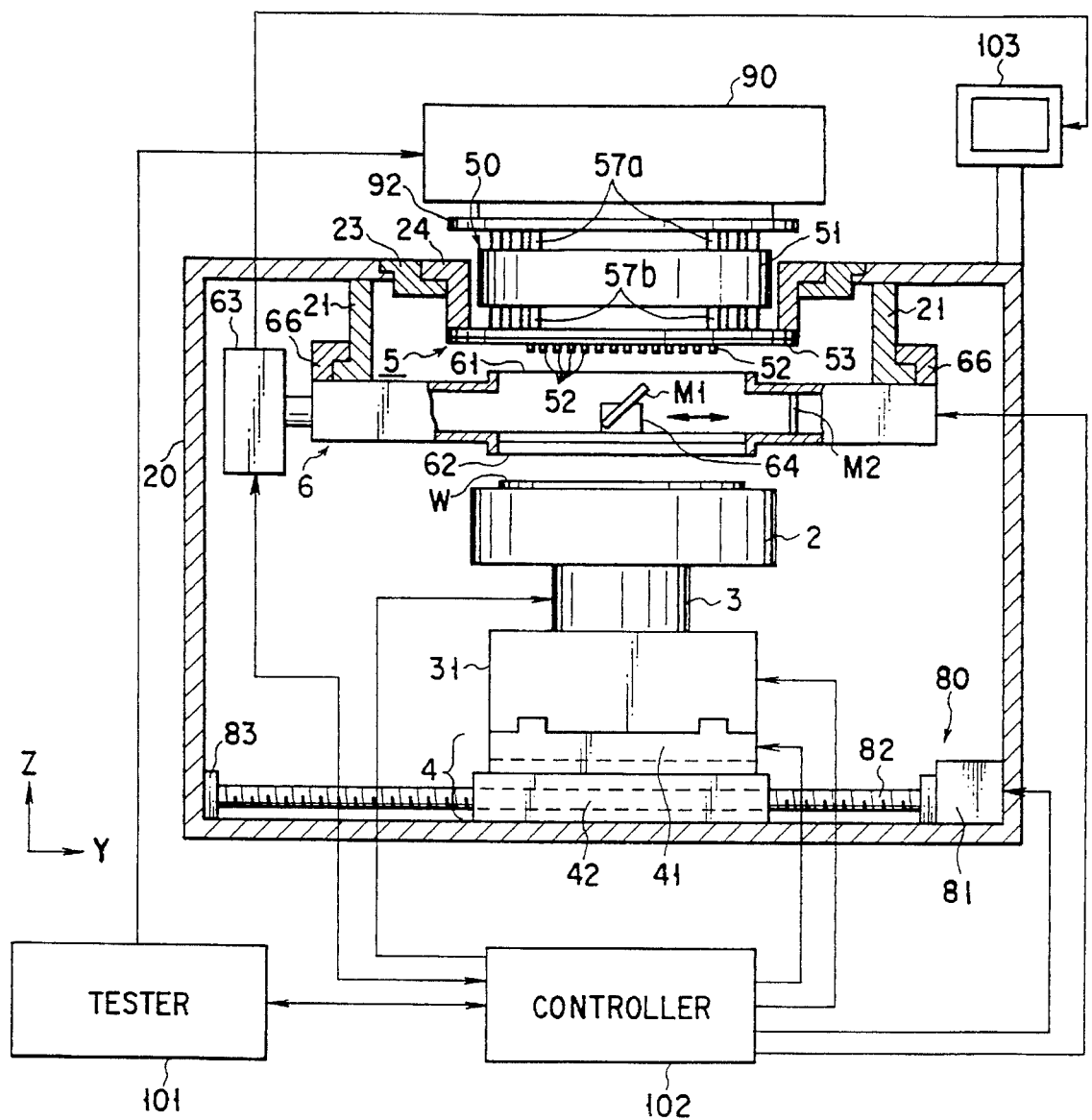
F I G. 1

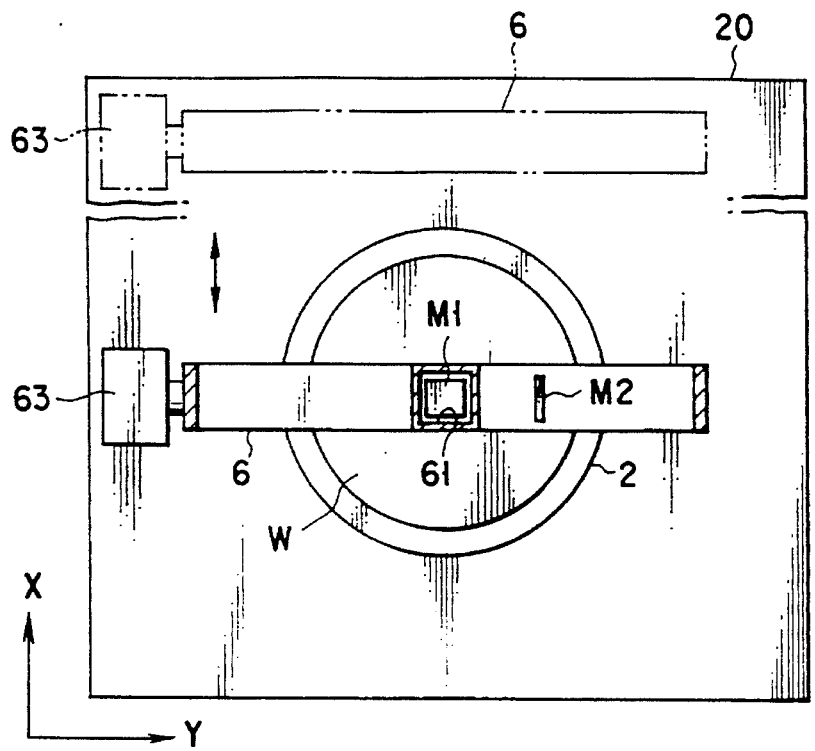
F I G. 3
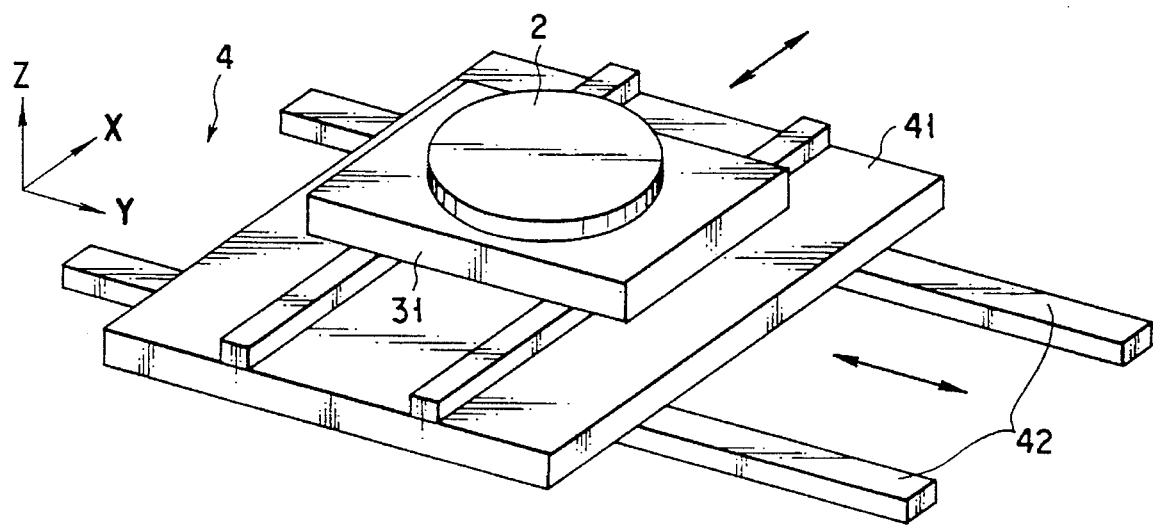
F I G. 4

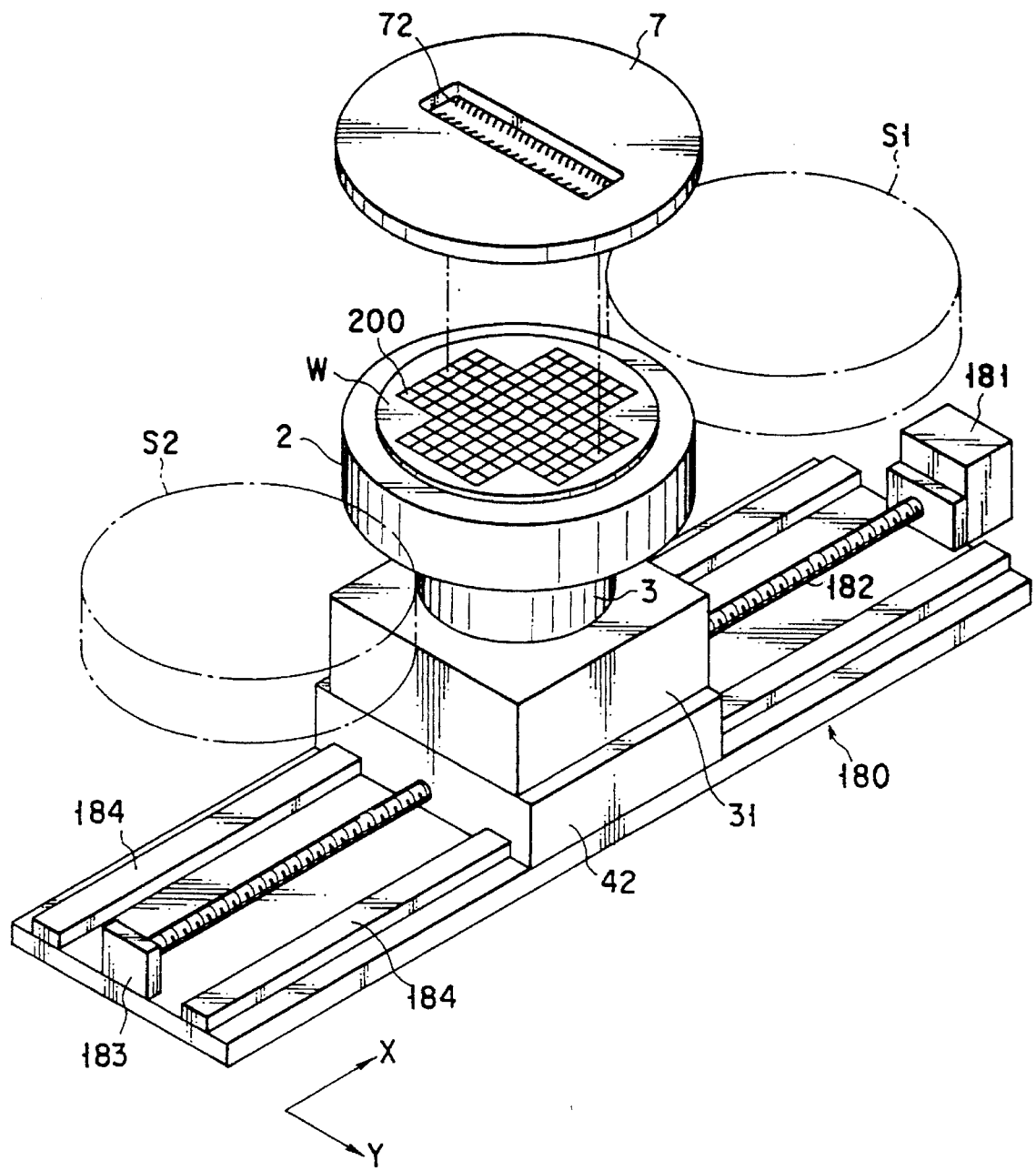
F I G. 5

PROBE APPARATUS FOR TESTING MULTIPLE INTEGRATED CIRCUIT DIES

BACKGROUND OF THE INVENTION

1. Field of the Invention

The present invention relates to a probe apparatus used for examining circuits such as semiconductor devices.

2. Description of the Related Art

By use of a conventional probe apparatus, tens to several hundreds of IC chips are examined sequentially one by one as moving the wafer stage in a step-by-step manner at a pitch corresponding to the distance between adjacent IC chips. With such a structure, the probing test is carried out in a subsequent manner, that is, after the test on an IC chip, the test is conducted to the adjacent one, and such an operation is repeated. A great number of pads are formed on an IC chip, and each pad has a rectangular shape with a side of about 20–200 μm. In order to bring a probe into contact with a pad having such an extremely small area, the pad and the probe must be aligned relatively with each other at a high accuracy.

U.S. patent application Ser. No. 922,791, now U.S. Pat. No. 5,321,352 discloses an alignment mechanism (so-called index mechanism) for aligning pads on a chip and probes with each other. In the index mechanism, the wafer stage is moved by fine adjustment in X and/or Y axis in accordance with the position where the tip of the probe is detected.

In the conventional index mechanism, the wafer stage must be aligned on an X-Y plane along both coordinates at a high accuracy, and the driving mechanism becomes complex, large in size, and costly.

Further, the move/stop action of the wafer stage must be repeated frequently for the number of times corresponding to the number of IC chips, thereby being likely to create vibration. Especially, the wafer stage has a small damping capacity due to its heavy weight, and therefore continues to vibrate for a long time after the adjustment is stopped. Consequently, the measurement for the next IC chip must wait until the vibration of the stage is ceased, lowering the throughput. In particular, in the case where the time required to carry out the test per one IC chip (time during which a test signal is transmitted) is short, the ratio of the non-test time (time during which a test signal is not transmitted) to the test cycle time becomes large. There rises a demand of shortening the non-test time.

In the conventional probe apparatus, the probe card circuit is electrically connected to the test head circuit via an insert ring so that a test signal is transmitted to the chip circuit. A pogo pin is set in the insert ring, and as one end of the pogo pin is pressed on a pad of the probe card circuit so as to bring the pogo pin and the pad into electrical contact with each other.

However, a pogo pin includes a great number of parts, and there are a great number of contact interfaces (contact points and contact surfaces) in a current-carrying line. Consequently, each line involves a high electrical resistance, and the electrical resistances of the lines greatly differ from each other. If the resistances of the pogo pins have a large irregularity, the test cannot be performed at a high accuracy. In order to carry out an accurate test, pogo pins of a similar resistance must be carefully selected, and such a selection work is very much complicated.

Further, each pogo pin includes a spring, which makes the inductance thereof high, and a great number of contact interfaces, which makes its insertion loss large. As a result, the measured value of the high-frequency test contains an error, and therefore it is very difficult to achieve an accurate measurement.

Furthermore, each pogo pin is maintaining its electrical contact by means of a spring, and therefore a reflection wave signal is sometimes created at the connecting section between the spring and the pogo pin in the high-frequency test, which is one of the factors which lower the accuracy of the test.

SUMMARY OF THE INVENTION

An object of the present invention is to provided a small-sized probe apparatus which can achieve a high throughput.

Another object of the present invention is to provide a probe test which can achieve a highly accurate test.

According to an aspect of the present invention, there is provided a probe apparatus comprising:

a stage for holding a substrate on which a plurality of device circuits are regularly arranged such that the device circuits are arranged substantially in a plane including an X-axis and a Y-axis, and the device circuits are arranged along the X-axis direction and the Y-axis direction;

a large number of contact members facing the substrate held on the stage, provided to corresponding to respective pads of the device circuit, and such as to be brought into contact collectively with the pads of all the device circuits on the substrate;

tester means for transmitting/receiving a test signal to/from the device via the contact members;

elevator means for elevating the stage in a z-axis direction;

alignment means for moving the stage in the X-axis and/or the Y-axis direction so as to align the pad to the contact member; and control means for controlling the alignment means and the elevator means.

According to another aspect of the present invention, there is provided a probe apparatus wherein contact members (contactors or probes) each corresponding to the respective one of the pads of all the chips arranged in one line in one of the X-axis and Y-axis directions, and brought into contact with the respective one all at once, are provided on a probe card, and the stage is moved stepwise in the X-axis direction or Y-axis direction so that the contact members are brought into contact consecutively with the chips of each line.

According to another aspect of the present invention, a substrate is placed on the stage, and an optical system is brought to a constant position between the substrate and the contact members so as to obtain the relative position of the pads of the substrate in relation to the contact members by means of image display means, and the stage is moved in X-axis, Y-axis, or θ direction to align the pads with the contact members by an alignment mechanism. Subsequently, the stage is ascended by the elevator mechanism such that the pads of the substrate and the contact members are collectively brought into contact with each other, thus executing the test. With such a structure, the substrate does not have to be moved consecutively stepwise, thereby improving the throughput.

Further, since the contact means are collectively brought into contact with the chips arranged on a substrate in the X-axis direction (or Y-axis direction), all should be done is that the substrate be moved stepwise only in the Y-axis direction (or X-axis direction). Consequently, a high throughput can be achieved with a simple structure only by providing a driving mechanism (index mechanism) for moving the stage in the Y-axis direction (or X-axis direction).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a cutaway view of the main portion of the probe apparatus according to an embodiment of the present invention;

FIG. 3 is a plan view showing the optical system;

FIG. 4 is a brief perspective diagram showing the X/Y-axis micro-scale adjustment mechanism (index mechanism);

FIG. 5 is an exploded perspective diagram showing a brief structure of a probe apparatus according to another embodiment;

DETAILED DESCRIPTION OF THE PREFERRED EMBODIMENTS

Figure 2:
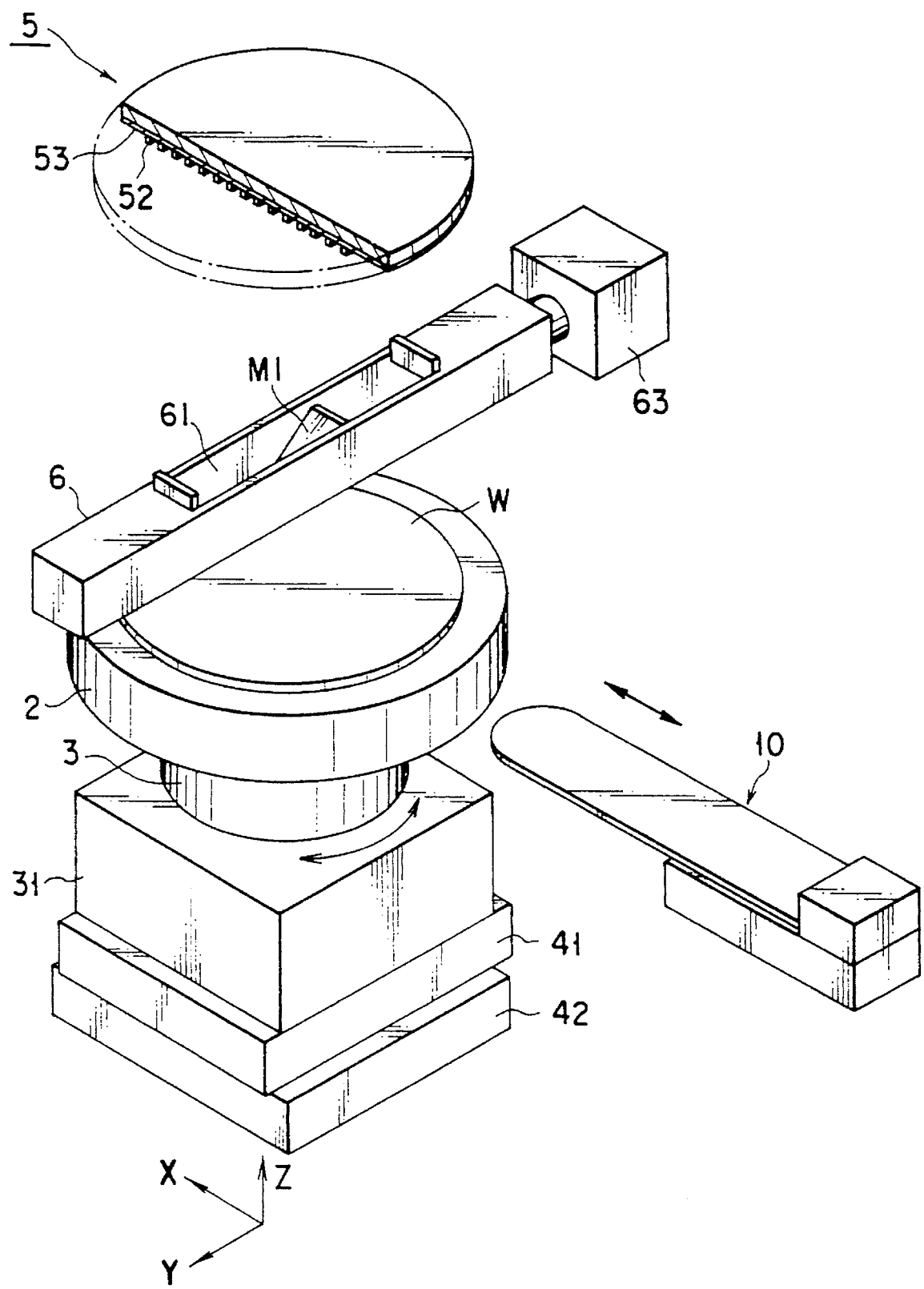
FIG. 2 is an exploded perspective diagram showing the main portion of the probe apparatus.

Various embodiments in which the probe apparatus according to the present invention is used in the probing test for semiconductor wafers will now be described with reference to accompanying drawings.

As shown in FIG. 1, a wafer stage 2 is provided in an outer casing 20 of the main frame of the probe apparatus. The wafer stage 2 has a vacuum chuck for holding a wafer W by attraction. The rotation mechanism 3 has a servomotor (not shown), and the wafer stage 2 is supported by the driving shaft of the servo motor. The rotation mechanism 3 is also supported by a shaft (not shown) of the elevator mechanism 31, which is further supported by an alignment mechanism (index mechanism) 4.

As shown in FIG. 4, the alignment mechanism 4 includes an X-axis micro-scale movement mechanism 41 for finely moving the wafer stage 2 in the X-axis direction by a distance corresponding to the total size of a several number of IC chips 200, and a Y-axis micro-scale movement mechanism 42 for finely moving the wafer stage 2 in the Y-axis direction by a distance corresponding to the total size of a several number of IC chips 200. The driving system of the micro-scale movement mechanisms 41 and 42 will not be shown in the figure; however, in the driving system, for example, a ball screw mechanism and a piezo-element may be used. Further, a Y-axis macro-scale movement mechanism 80 is provided under the micro-scale movement mechanism 42. One stroke set by the Y-axis macro-scale movement mechanism 80 is larger than the diameter of a wafer W, and therefore the wafer stage 2 is moved stepwise in the Y-axis direction by the mechanism 80.

The probe card 5 is provided above the wafer stage 2 such that a great number of contactors 52 face the silicon wafer W. The probe card 5 is set on a support ring 24, which is further set on the housing 20 via the insert ring 23.

A contact ring 50 is provided above the probe card 5. The contact ring 50 is supported by the support ring 24 and has an opening 50a at its center. A main portion 51 of the contact ring 50 is made of an insulation material such as resin. A great number of contact elements 57a are provided on the upper surface side of the main portion 51, and a great number of contact elements 57b are provided on the lower surface side of the ring main portion 51.

Figure 8:
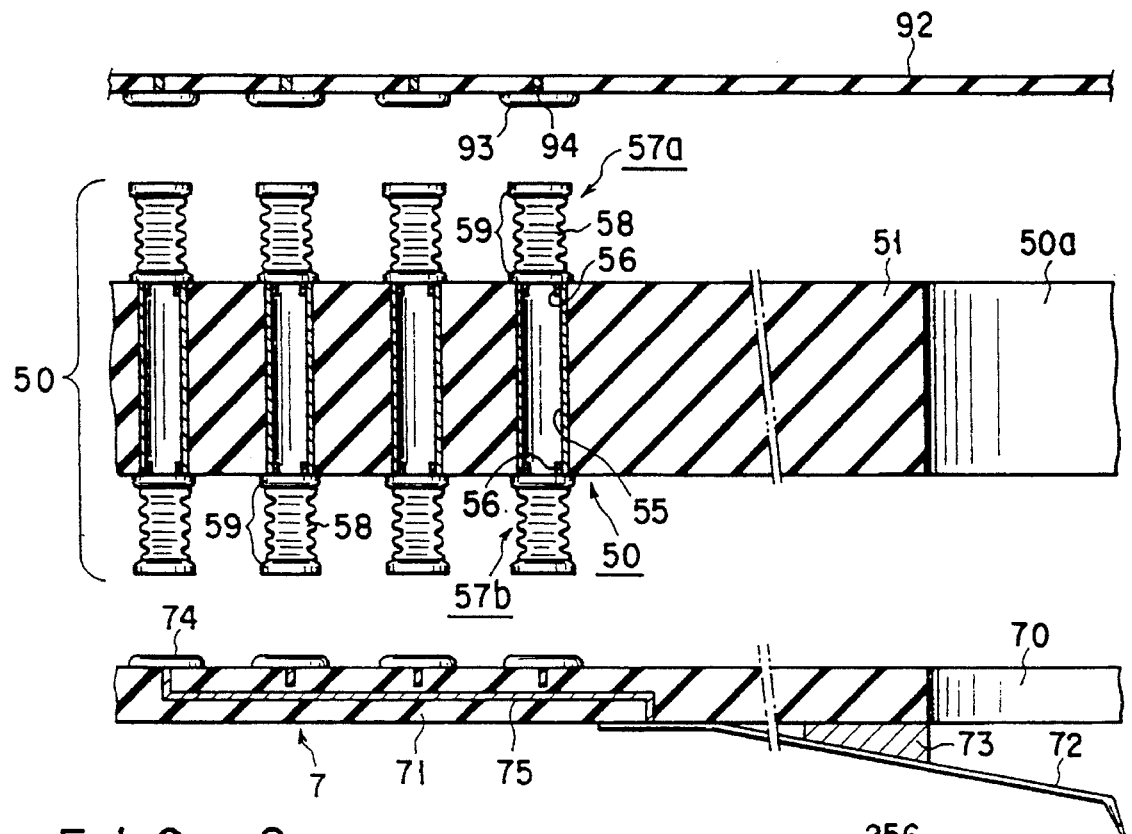
FIG. 8 is a partially enlarged cross section showing the probe card, the contact ring and the performance board.

As can be seen in FIG. 8, each of the contact elements 57a and 57b consists of a bellows portion 58 and a pair of terminal sleeves 59. The bellows portion 58 is made of a malleable nickel material the surface of which is gold-plated, and is extensible/contractible in the thickness direction of the contact ring 50. Each of the pair of the terminal sleeves 59 is provided at each end of the bellows portion 58, and has a diameter substantially the same as that of the bellows portion 58. For example, the diameter of the sleeve 59 is about 1 mm.

One hundred or more IC chips 200 are formed on a wafer W, and tens or several hundred pads are arranged on each IC chip 200. The contactors 52 are arranged on the probe card 5 such as to correspond to the pads of the chip 200. Each contactor 52 is implanted on the lower surface of the probe card 5, and is connected to a circuit of the printed board. Each contactor 52 is made of a gold-plated nickel material. Each contactor 52 is backed up by an elastic member 53 such that a great number of contactors 52 are collectively brought into contact with the pads. U.S. patent application Ser. No. 07/978,389 (now U.S. Pat. No. 5,412,239) discloses a probe card similar to the probe card 5.

A test head 90 is set on the upper surface portion of the housing 20. The test head 90 is electrically connected to a tester 101 and a performance board 92. As shown in FIG. 8, a number of pads 93 are provided on the lower surface of the performance board 92. Each pad 93 is electrically connected to the inner circuit of the test head 90 by a current-carrying line 94. Meanwhile, a great number of pads 74 are provided on the upper surface of the probe card 7. Each pad 74 is connected to the probe 72 via a current-carrying line 75 in a one-to-one manner. It should be noted that in the case of a bump-pad type probe card 5, each pad 74 is connected to each connector 52 in a one-to-one manner.

The test head 90 serves to send a high-frequency signal to the probe card 5 via the performance board 92 and the contact ring 50 in reply to an instruction from the tester 101. A tester 101 and a controller 102 are connected to each other. The input section of the controller 102 is connected to the tester 101 and a TV camera 63. The output section of the controller 102 is connected to each of the rotation mechanism 3, the ascending/descending mechanism 31, the X-axis micro-scale movement mechanism 41, the Y-axis micro-scale movement mechanism 42, the Y-axis macro-scale movement mechanism 80, and the tester 101.

A CRT display 103 serving as image display means is provided at the upper surface section of the casing 20. The TV camera 63 is arranged such that the optical axis of the camera is aligned with that of the optical system 6. The TV camera 63 has a switch for selecting a low- or high-magnification display. A micro-image (having various magnifications) of the chips 200 is sent from the TV camera 63 to the CRT display 103.

As shown in FIGS. 1–3, the optical system 6 is supported by linear guides 21 and 66 to be movable in the X-axis direction. U.S. patent application Ser. No. 08/034,779 (now U.S. Pat. No. 5,416,592) discusses in detail about structural members similar to the optical system 6, the TV camera 63, and the image display means 103. When the optical system 6 is stopped substantially at the center of the casing 20, the system 6 is located between the stage 2 and the probe card 5. An upper opening 61 is formed in the upper center portion of the optical system 6, and a lower opening 62 is formed in the lower center thereof. The upper and lower openings 61 and 62 are formed such that the probe card 5 can be seen from the stage 2 side through the openings 61 and 62. The optical system 6 has a hollow cylindrical shape, and includes the first and second mirrors M1 and M2 inside. The first mirror M1 is a half mirror, and the second mirror M2 is a total reflection mirror.

The first mirror M1 is located near the TV camera 63, and serves to reflect the image of the contactors 52 through the upper opening 61 to sent it to the TV camera 63. The first mirror M1 can move in the Y-axis direction within the optical system 6. The second mirror M2 is located far from the TV camera 63, and serves to totally reflecting the image of the wafer W reflected on the first mirror M1, toward the TV camera 63.

The half mirror M1 is set on the movement mechanism 64, and can be moved in the horizontal direction within an area corresponding to the region defined between one side to the other side of each line of the IC chips arranged on the wafer W. As shown in FIG. 2, the wafer W is passed between the stage 2 and a cassette (not shown) by carrying means 10 such as of a belt mechanism.

The operation of the probe apparatus will now be described.

First, a wafer W is withdrawn from a cassette, and pre-aligned (to orient an orientation flat of the wafer to a desired direction). Then, the wafer W is placed on the stage 2. On this wafer W, there are several hundred to-be-tested IC chips each having thirty two pads, and each of the IC chips is a size of 8 mm×12 mm.

Next, the optical system 6 is moved to a position between the probe card 5 and the wafer W. Then, while monitoring both image of the contactors 52 and that of the wafers W by use of the TV camera 63, the group of the IC chips 200 on the wafer are aligned with the contactors 52 in terms of the X-, Y-, and θ rotation axes by means of the X-axis and Y-axis micro-scale mechanisms 41 and 42, and the rotation mechanism 3.

The image of the contactors 52 is reflected on the half mirror M1 and input to the TV camera 63, and the image of the pads of chips 200 is also input to the TV camera 63 via the half mirror M1, the total reflection mirror M2, and again the half mirror M1. In this case, the optical system 6 is moved in the X-axis direction while moving the half mirror M1 in the Y-axis direction by the mirror movement mechanism 64. Thus, it is possible to monitor any part of the array of the IC chips 200 on the wafer W.

Then, the optical system 6 is moved away from the lower position of the probe card 5, and subsequently the stage 2 is raised so as to bring all the pads on the wafer W into contact collectively with the contactors 52. As switching the connection with the signal paths on the test head 90 side one after another, the probing test is executed by the tester 101. After the completion of the test, the wafer W is set back in the cassette by the carrying mechanism 10.

The data obtained by the test is stored in the memory of the host computer for a marking device via a direct on-line or a floppy disk, and the tested wafer is subjected to marking using the marking device based on the data stored in the host computer.

In this embodiment, the contact means are brought into contact with the pads of all the IC chips on a wafer W at once, and therefore it is not necessary to move the stage 2 stepwise each time IC chips are measured. Consequently, the time required for test per one wafer W is shortened, thus achieving a high throughput.

Another embodiment of the present invention will now be described with reference to FIG. 5.

In this embodiment, a great number of probes 72 are provided on a probe card 7 in one line in the Y-axis direction. The probes 72 are arranged such that each corresponds to each of IC chips 200 aligned in the Y-axis direction on a wafer W, and the probes are brought into contact collectively with all the pads of chip series 200 (shaded area). The "chip series" mean the chips arranged in series along the X-axis or the Y-axis to have the maximum length, of those on a wafer W.

A rotation mechanism 3, an elevator mechanism 31 and a Y-axis direction micro-scale movement mechanism 42 are provided under the wafer stage 2. An X-axis macro-scale movement mechanism 180 is located under the Y-axis direction micro-scale movement mechanism 42. A ball screw 182 of the mechanism 180 is geared with the nut of the mechanism 42, and a linear guide 184 is engaged with the guide groove of the mechanism 42. Thus, the stage 2 is slidably moved in the X-axis direction along with the mechanism 42. One end of the ball screw 182 is connected to the driving shaft of a motor 181, and the other is connected to a stopper 183.

The wafer stage 2 is moved by the X-axis macro-scale movement mechanism 180 between an area S1 for picking up a wafer W and an alignment area S2. More specifically, the wafer stage 2 is brought to the pick-up area, where a wafer W is placed on the wafer stage 2. Further, the wafer stage 2 is brought to the alignment region S2, where probe alignment (alignment of the tip ends of probes 72 with respect to pads) is carried out. In the probe alignment, while monitoring the pads on IC chips 200 and probes 72 within a microscope by use of the optical system 6, the stage 2 is moved in a micro-scale fashion along the θ rotation axis, X-axis, and Y-axis by the mechanisms 31, 42, and 180. With this operation, the probes 72 are brought into contact with all the pads of the IC chips 200 arranged in series, so as to transmit a test signal. After the completion of the test for the group of chips in the first array, the stage 2 is moved stepwise in the X-axis direction by the movement mechanism 80, and the test for the chip group of the second array is executed.

According to the probe apparatus, the probes 72 are brought into contact with the IC chips 200 aligned in series, and therefore the wafer stage 2 should be moved stepwise only in the X-axis direction. Consequently, the time required for moving the stage 2 (time required for index) can be shortened, thereby improving the throughput.

Further, it is not necessary to provide a mechanism for moving the wafer stage 2 stepwise in the Y-axis direction, and therefore the size of the apparatus can be reduced, and the structure thereof can be simplified.

The contact ring 50 and the probe card 7 will now be explained with reference to FIGS. 6–8.

As shown in FIG. 8, the contact ring 50 is located directly above the probe card 7, and the ring 50 and the card 70 are electrically connected to each other via the contact element 57b. Directly above the contact ring 50, the performance board 92 is provided, and the ring 50 and the board 90 are electrically connected to each other via the contact element 57a. The performance board 92 is electrically connected to the test head 90.

Figure 6:
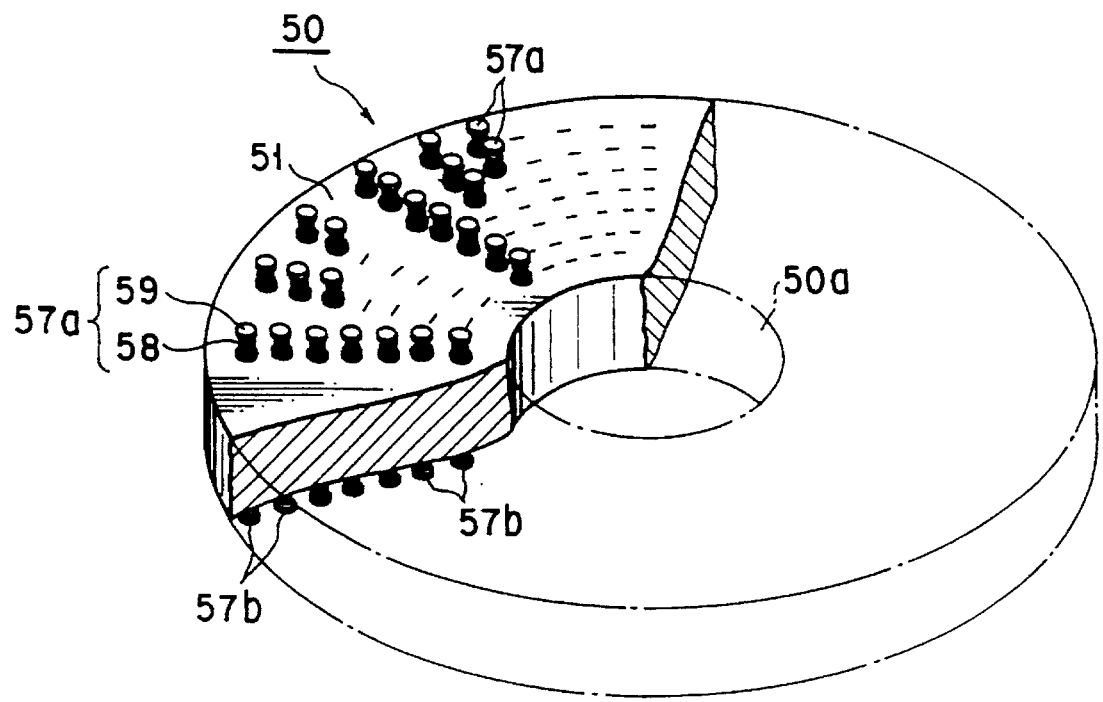
FIG. 6 is a perspective view showing a contact ring.

As shown in FIG. 6, a great number of contact elements 57a are provided on the upper surface of the contact ring 50, and a great number of contact elements 57b are provided on the lower surface of the contact ring 50. An opening 50a is formed at the center of the contact ring 50, and the main portion 51 of the ring 50 is made of an insulating material such as synthesis resin. Each of contact elements 57a and 57b consists of bellows 58 and a terminal sleeve 59. The bellows 58 is made of a malleable nickel material the surface of which is gold-plated, and has a flexibility. The terminal sleeve 59 has substantially the same diameter as that of the bellows 58, which is about 1 mm.

A through-hole portion 55 the inner surface of which is plated with a conductor such as gold is formed in the main portion 51 of the ring. The upper and lower contact elements 57a and 57b are electrically connected to each other by the through-hole portion 55, and are fixed to the through-hole portion 55 by means of a small ring 56.

Figure 7:
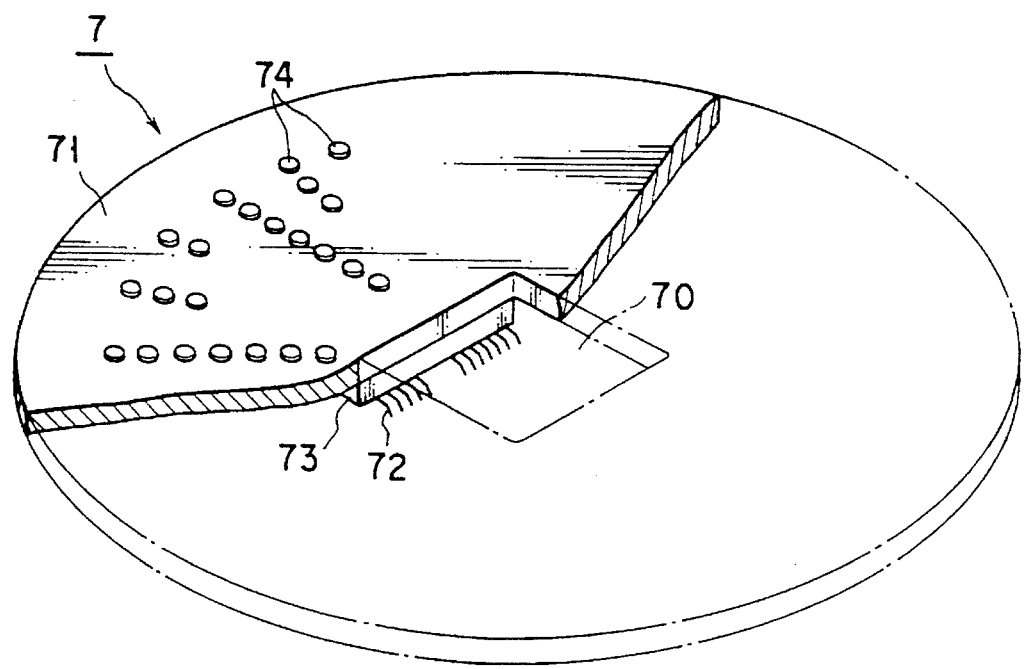
FIG. 7 is a perspective view showing a probe card.

As shown in FIG. 7, the probes 72 are supported by a supporting member 73 on the lower surface of the print substrate 71, and the tip end of each probe extends toward the center opening 70 of the probe card. Each of the probes 72 is electrically connected to electrode 74 by means of circuit 75 of the printed board. Each of the electrodes 74 is a bump pad which is made of gold.

On the lower surface of the performance board 92, a great number of electrodes 93 some of which used for inputting/ outputting signals, some of which used for ground, and some of which used for applying a power voltage (not shown), are arranged such that each corresponding to each of the pads of the IC chips 200.

The operation of the apparatus according to the above embodiment will now be described.

First, a wafer W is placed on the wafer stage 2. Then, while monitoring the tip ends of the probes 72 through the contact ring opening 50a and the probe card opening 70, the stage 2 is moved in the X-axis, Y-axis, and/or θ direction by means of the driving mechanism 31 such that the position of each probe 72 is aligned with that of each electrode pad of the wafer W.

Next, the wafer stage 2 is raised to a given level such that the probes 72 are brought into contact with the electrode pads of the wafer W. Thus, high-frequency signals are sent from the test head 90 to the probes 72, and the quality of each IC chip 200 is examined.

With the contact ring type mentioned above, since the contact surface area is small as compared to that of the conventional pogo pin type, the electronic resistance (direct current resistance) is as small as for example about 0.005 Ω–0.03 Ω. Consequently, highly accurate test results substantially free from the measurement error can be achieved.

Further, since the bellows portion 58 is employed in place of the spring of the conventional pogo pin, the inductance can be reduced to a small value, for example, about $3.0 \times 10^{-9}$ to $9.0 \times 10^{-10}$ Henry, and so can be the insertion loss. Consequently, the high-frequency loss can be reduced to a very small level. Further, because of the small contact area, substantially no noise signals created by the reflection on the contact surface are produced.

The bellows portion 58 has a high durability, and therefore has a longer life than the conventional pogo pin. A good reproducibility of the contact point can be guaranteed. Further, generation of particles caused by friction between metals during a stroke of spring is avoided, thereby preventing the contamination of the wafer W with particles.

Figure 9:
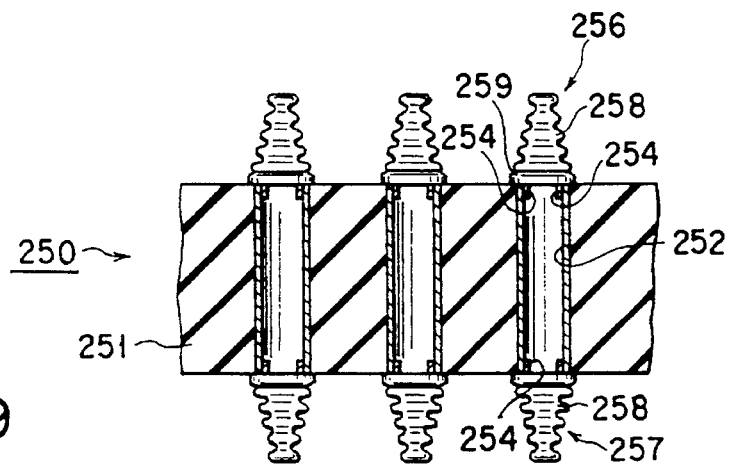
FIG. 9 is a partial cross section showing a contact ring according to another embodiment.

As shown in FIG. 9, the contact elements 256 and 257 may be set on the front and rear surfaces of the main body 251 of the contact ring in place of the contact elements 57a and 57b. A bellows 258 has a distal end portion the diameter of which is smaller than that of a proximal end portion thereof. The bellows 258 is connected to a terminal 259, and further fixed to a through-hole portion 52 via a small ring 254.

As means for electrically connecting upper and lower contact elements 256 and 257, a conductor pin may be used in place of the through-hole portion 252.

Figure 10:
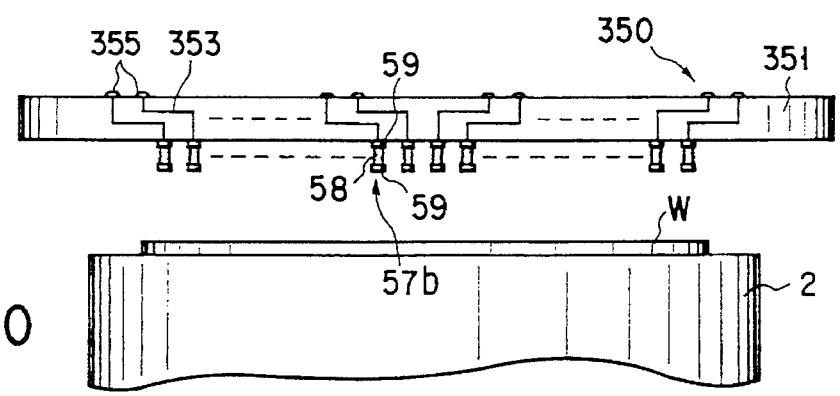
FIG. 10 is a brief diagram showing a probe apparatus according to another embodiment.

Another embodiment of the present invention will now be described with reference to FIG. 10.

In this embodiment, a contact element 57b having a bellows portion 58 and a terminal sleeve 59 similar to those described in the above embodiment, is set on the lower surface of a print substrate 351. Electrodes 355 each electrically connected to each of contact elements 57b via a wiring layer 353 within the print substrate 351, are formed on the upper surface of the print substrate 351, thus forming a probe card 250.

With the probe apparatus having such a structure, when the probe card 250 is pressed against a wafer W on the stage 2, the tip end of each of the contact elements 256 is pressed on each of the pads of the chips 200, ensuring the contact therebetween. Thus, a high-precision test can be performed.

According to the embodiment, the load weight required to ensure the contact between a contact element and an electrode pad is about 1/10 of the case of the conventional probe. Therefore, the wafer stage can be set in parallel with the surface on which the tip ends of the contact elements of a probe card are arranged, without using a weight-proof bearing portion for the wafer stage. Further, since the bellows portion has a high durability, and a good reproducibility of the contact point can be guaranteed after the contact with the wafer W is repeated many times.

with the bellows portion, the tip end of a contact element is extendible/contractible, the irregularity of pads in position (level), caused by deformation such as warp of the wafer W, can be absorbed, thereby increasing the area which can be covered by one probe contact operation in the test. For example, in the case where contact elements are brought into contact with electrode pads of IC pads of a wafer, the effect of the present invention is particularly significant.

Lastly, the present invention can be applied not only to measurement of IC chips arranged on a wafer, but also to examination of IC chips after package, or examination of an LCD substrate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus comprising:

a stage for holding a substrate on which a plurality of device circuits are regularly arranged such that the device circuits are arranged substantially in a plane including an X-axis direction and a Y-axis direction, and said device circuits are arranged along said X-axis direction and said Y-axis direction;

a plurality of contact members facing the substrate held on the stage, provided to corresponding pads of the device circuits, such as to be brought into contact collectively with the pads of all the device circuits on the substrate;

tester means for transmitting and receiving a test signal to and from the device circuits via the contact members;

an optical system located between the stage and the contact members for picking up an image of the pads and the contact members;

image display means for displaying the picked up image by said optical system;

switching means for selecting high- or low-magnification displays of the picked up image;

elevator means for elevating the stage in a Z-axis direction;

alignment means having a macro-scale moving mechanism for moving said stage on a macro-scale in said Y-axis direction and a micro-scale moving mechanism for moving said stage on a micro-scale in each of said X-axis and Y-axis directions; and control means for controlling said alignment means and said elevator means based on the picked up image.

2. A probe apparatus according to claim 1, further comprising moving means for moving the optical system along an array of the device circuits.

3. A probe apparatus according to claim 1, wherein the optical system stays at a constant position with respect to the substrate during alignment.

4. A probe apparatus according to claim 1, further comprising a contact ring for holding said contact members, each of the contact members having a conductive bellows portion which is extensible and contractible in a thickness direction of said contact ring.

5. A probe apparatus according to claim 4, wherein each of the contact members further comprises a conductive terminal sleeve at a tip end of the conductive bellows portion.

6. A probe apparatus comprising:

a stage for holding a substrate on which a plurality of device circuits are regularly arranged such that the device circuits are arranged substantially in a plane including an X-axis direction and a Y-axis direction, and said device circuits are arranged along said X-axis direction and said Y-axis direction;

a plurality of contact members facing the substrate held on the stage, provided to corresponding pads of the device circuits arranged in series, such as to be brought into contact collectively with the pads of the device circuits arranged in series;

tester means for transmitting and receiving a test signal to and from the device circuits via the contact members;

an optical system located between the stage and the contact members for picking up an image of the pads and the contact members;

image display means for displaying the picked up image by said optical system;

switching means for selecting high- or low-magnification displays of the picked up image;

elevator means for elevating the stage in a Z-axis direction;

alignment means having a macro-scale moving mechanism for moving said stage on a macro-scale in said Y-axis direction and a micro-stage moving mechanism for moving said stage stepwise in any of said X-axis and Y-axis directions by a distance corresponding to one device circuit; and control means for controlling said alignment means and said elevator means based on the picked up image.

7. A probe apparatus according to claim 6, wherein the alignment means serves to move the stage stepwise in the X-axis direction.

8. A probe apparatus according to claim 6, wherein the alignment means serves to move the stage stepwise in the Y-axis direction.

9. A probe apparatus comprising:

a stage for holding a substrate on which a plurality of device circuits are regularly arranged such that the device circuits are arranged substantially in a plane including an X-axis direction and a Y-axis direction, and said device circuits are arranged along said X-axis direction and said Y-axis direction;

a plurality of contact members facing the substrate held on the stage, provided to corresponding pads of the device circuits, arranged in series, such as to be brought into contact collectively with the pads of the device circuits in series;

tester means for transmitting and receiving a test signal to and from the device circuits via the contact members;

an intermediate contact member, provided between the tester means and the contact members including conductive bellows portions having a flexibility in a z-axis direction, for electrically connecting the tester means and the contact members;

an optical system located between the stage and the contact members for picking up an image of the pads and the contact members;

image display means for displaying the picked up image by said optical system;

switching means for selecting high- or low-magnification displays of the picked up image;

elevator means for elevating the stage in a Z-axis direction;

alignment means having a macro-scale moving mechanism for moving said stage on a macro-scale in said Y-axis direction and a micro-step moving mechanism for moving said stage stepwise in any of said X-axis and Y-axis directions by a distance corresponding to one device circuits; and control means for controlling said alignment means and said elevator means based on the picked up image.

10. A probe apparatus according to claim 9, wherein each of the contact members further comprises a conductive terminal sleeve at a tip end of the conductive bellows portion.

11. A probe apparatus according to claim 10, further comprising moving means for moving the optical system along an array of the device circuits.

12. A probe apparatus according to claim 10, wherein the optical system stays at a constant position with respect to the substrate during alignment.

13. A probe apparatus comprising:

a stage for holding a substrate on which a plurality of device integrated circuit dies are regularly arranged such that said dies are arranged substantially in a plane including an X-axis direction and a Y-axis direction, and said dies are arranged along said X-axis direction and said Y-axis direction;

a plurality of contact members facing the substrate held on the stage and corresponding to respective pads of said dies, to be brought into contact collectively with respective pads of all of said dies on the substrate at the same time;

tester means for transmitting and receiving a test signal to and from the device circuits via the contact members;

an optical system located between the stage and the contact members for picking up an image of the pads and the contact members;

image display means for displaying the picked up image by said optical system;

switching means for selecting high- or low-magnification displays of the picked up image;

elevator means for elevating the stage in a Z-axis direction;

alignment means for moving the stage in at least one of said X-axis and said Y-axis direction so as to align said pads with said contact members; and control means for controlling said alignment means and said elevator means based on the picked up image, thereby each of the contact members is brought into contact collectively with each of the pads of said all dies.

14. A probe apparatus comprising:

a stage for holding a substrate on which a plurality of device integrated circuit dies are regularly arranged such that said dies are arranged substantially in a plane including an X-axis direction and a Y-axis direction, and said dies are arranged in series along said X-axis direction and said Y-axis direction;

a plurality of contact members facing the substrate held on the stage in correspondence with pads of plural of said dies arranged in series, such as to be brought into contact collectively with said pads of plural of said dies arranged in series;

tester means for transmitting and receiving a test signal to and from the device circuits via the contact members;

an optical system located between the stage and the contact members for picking up an image of the pads and the contact members;

image display means for displaying the picked up image by said optical system;

switching means for selecting high- or low-magnification displays of the picked up image;

elevator means for elevating the stage in a Z-axis direction;

alignment means for moving the stage stepwise in said X-axis or said Y-axis direction by a distance corresponding to at least one die so that at each step of moving said stage said plurality of contact members face pads of different plural series arranged dies and are collectively brought into contact with the pads of the different series arranged dies; and control means for controlling said alignment means and said elevator means based on the picked up image, thereby each of the contact members is brought into contact collectively with each of pads of said all dies.

* * * * *